United States Patent
Yoshino

(10) Patent No.: US 11,211,449 B2
(45) Date of Patent: Dec. 28, 2021

(54) SEMICONDUCTOR DEVICE

(71) Applicant: Mitsubishi Electric Corporation, Tokyo (JP)

(72) Inventor: Manabu Yoshino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1 day.

(21) Appl. No.: 16/452,688

(22) Filed: Jun. 26, 2019

(65) Prior Publication Data

US 2020/0212171 A1    Jul. 2, 2020

(30) Foreign Application Priority Data

Dec. 28, 2018 (JP) .............................. JP2018-247101

(51) Int. Cl.
*H01L 29/06* (2006.01)

(52) U.S. Cl.
CPC ........ *H01L 29/063* (2013.01); *H01L 29/0649* (2013.01)

(58) Field of Classification Search
CPC ........................... H01L 29/063; H01L 29/0649
See application file for complete search history.

(56) References Cited

U.S. PATENT DOCUMENTS

| | | | | |
|---|---|---|---|---|
| 10,461,181 | B2 * | 10/2019 | Kim | ..................... H01L 29/0615 |
| 2004/0232522 | A1 * | 11/2004 | Shimizu | .............. H01L 29/7823 |
| | | | | 257/548 |
| 2013/0161645 | A1 * | 6/2013 | Takahashi | ........... H01L 29/0619 |
| | | | | 257/77 |
| 2015/0021711 | A1 * | 1/2015 | Jonishi | ................ H01L 27/0285 |
| | | | | 257/401 |
| 2018/0069076 | A1 * | 3/2018 | Tanaka | ................... H01L 27/092 |

FOREIGN PATENT DOCUMENTS

| | | |
|---|---|---|
| JP | H06-224291 A | 8/1994 |
| JP | 4326835 B2 | 9/2009 |

* cited by examiner

*Primary Examiner* — Stephen M Bradley
(74) *Attorney, Agent, or Firm* — Studebaker & Brackett PC

(57) ABSTRACT

A semiconductor device wherein a high-side circuit region, a low-side circuit region, and a high-voltage MOS that transmits a signal between the high-side circuit region and the low-side circuit region are provided on one semiconductor substrate, includes: a high-voltage isolation region isolating the high-side circuit region and the low-side circuit region from each other; a trench isolation isolating the high-voltage MOS and the high-voltage isolation region from each other; an N-type diffusion layer provided on an upper surface of the semiconductor substrate in the high-side circuit region and the high-voltage isolation region; and an N-type region provided on both sides of the trench isolation and having an impurity concentration lower than an impurity concentration of the N-type diffusion layer.

10 Claims, 7 Drawing Sheets

SEMICONDUCTOR DEVICE

BACKGROUND OF THE INVENTION

Field

The present invention relates to a semiconductor device.

Background

An HVIC (High Voltage IC) used for driving a power chip in a half bridge configuration includes a low-side circuit region for which the substrate potential is the reference voltage, a high-side circuit region, and a level shift circuit. In plan view, the outer periphery of the high-side circuit region is surrounded by a high-voltage isolation region having a RESURF isolation structure and electrically isolated from the substrate potential to have a high breakdown voltage by the RESURF effect. A high-voltage MOS of the level shift circuit transmits signals between the low-side circuit region and the high-side circuit region with a large potential difference.

It is necessary to electrically isolate the high-voltage MOS and the high-voltage isolation region from each other. Forming the high-voltage MOS outside the RESURF isolation structure for this purpose leads to an increase in chip size. A low-concentration P-type layer used for isolation of a high-voltage MOS and a high-voltage isolation region from each other requires a large width of the P-type layer in order to suppress punch through. Since isolation is achieved by a P-N junction, it is necessary to suppress junction leakage and the leakage current caused by the parasitic structure. In contrast to this, isolating a high-voltage MOS and a high-voltage isolation region from each other with a trench isolation enables chip size reduction and suppression of the leakage current caused by the P-N junction.

When a high voltage is applied between the high-side circuit region and the low-side circuit region, a depletion layer spreads from the interface between a P-type diffusion layer and an N-type diffusion layer. However, the depletion is inhibited in the N-type diffusion layer adjoining the trench isolation as compared to other regions. Thus, a transient leakage current flows and circuit malfunctions occur. A technique for accelerating depletion in a RESURF isolation structure has been proposed, wherein a P-type layer is provided on both sides of the trench isolation (see, for example, Japanese Patent No. 4326835).

SUMMARY

However, because a P-N junction is provided on both sides of the trench isolation, there was the problem of a large junction leakage.

The present invention was made to solve the problem described above and it is an object of the invention to provide a semiconductor device configured to achieve electric isolation between a high-voltage MOS and a high-voltage isolation region with a small area and to reduce leakage current to improve the malfunction tolerance.

A semiconductor device according to the present invention wherein a high-side circuit region, a low-side circuit region, and a high-voltage MOS that transmits a signal between the high-side circuit region and the low-side circuit region are provided on one semiconductor substrate, includes: a high-voltage isolation region isolating the high-side circuit region and the low-side circuit region from each other; a trench isolation isolating the high-voltage MOS and the high-voltage isolation region from each other; an N-type diffusion layer provided on an upper surface of the semiconductor substrate in the high-side circuit region and the high-voltage isolation region; and an N-type region provided on both sides of the trench isolation and having an impurity concentration lower than an impurity concentration of the N-type diffusion layer.

In the present invention, the N-type region having a lower impurity concentration is provided on both sides of the trench isolation so that depletion is accelerated. The transient leakage current that flows when a high voltage is applied is thus reduced and the malfunction tolerance can be improved. Moreover, the high-voltage MOS and the high-voltage isolation region are isolated from each other by the trench isolation. Therefore, the electric isolation of the high-voltage MOS and the high-voltage isolation region from each other can be realized with a small area because it is only necessary to secure a sufficient width of the trench isolation.

Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
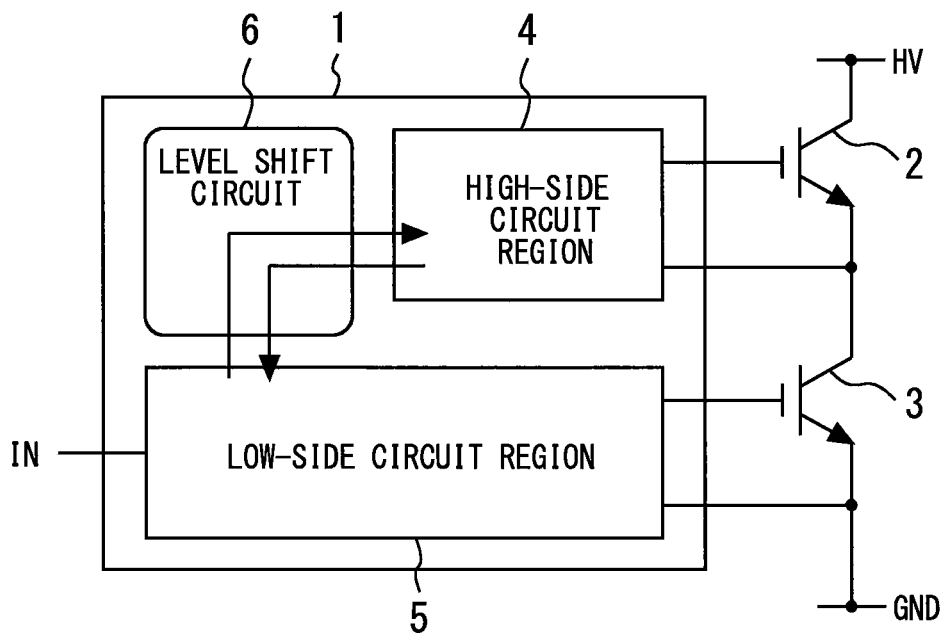
FIG. 1 is a block diagram illustrating a semiconductor device according to a first embodiment.

FIG. 1 is a block diagram illustrating a semiconductor device according to a first embodiment. The semiconductor device 1 is an HVIC used for driving power chips 2 and 3 in a half bridge configuration. The semiconductor device 1 includes a high-side circuit region 4, a low-side circuit region 5, and a level shift circuit 6 that transmits signals between the high-side circuit region 4 and the low-side circuit region 5. The low-side circuit region 5 drives the power chip 3 in accordance with an input signal IN relative to the substrate potential GND as a reference. The high-side circuit region 4 is isolated from the substrate potential to have a high breakdown voltage and drives the power chip 2 in accordance with an input signal IN.

Figure 2:
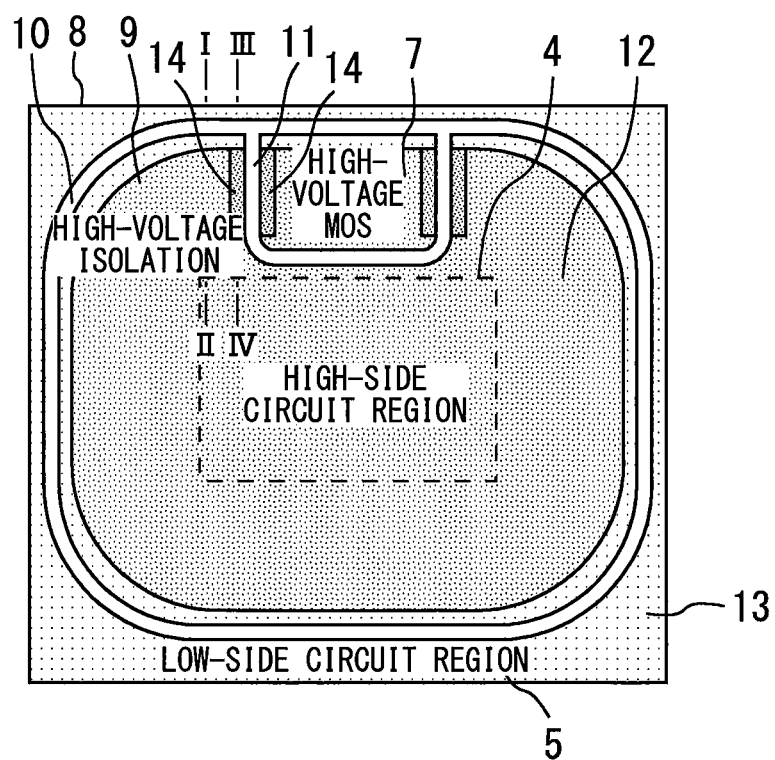
FIG. 2 is a top plan view illustrating the vicinity of the high-side circuit region of the semiconductor device according to the first embodiment.

FIG. 2 is a top plan view illustrating the vicinity of the high-side circuit region of the semiconductor device according to the first embodiment. The high-side circuit region 4, low-side circuit region 5, and a high-voltage MOS 7 are provided on one semiconductor substrate 8. The high-voltage MOS 7 is either a high-voltage NMOS or a high-voltage PMOS provided in the level shift circuit 6, and transmits signals between the high-side circuit region 4 and the low-side circuit region 5.

A high-voltage isolation region 9 surrounds the high-side circuit region 4 to electrically isolate the high-side circuit region 4 and the low-side circuit region 5 from each other. The high-voltage MOS 7 is provided in a RESURF isolation structure in which the high-voltage isolation region 9 is provided. A trench isolation 10 is provided in the low-side circuit region 5 such as to surround the high-voltage isolation region 9 and the high-voltage MOS 7. A trench isolation 11 is provided in a direction from the low-side to the high-side to isolate the high-voltage MOS 7 and the high-voltage isolation region 9 from each other.

An N-type diffusion layer 12 is provided on the upper surface of the semiconductor substrate 8 in the high-side circuit region 4 and the high-voltage isolation region 9. A P-type diffusion layer 13 is provided on the upper surface of the semiconductor substrate 8 in the low-side circuit region 5. $N^-$-type regions 14 having an impurity concentration lower than that of the N-type diffusion layer 12 are provided on both sides of the trench isolation 11. For the sake of simplicity, FIG. 2 only shows the N-type diffusion layer 12, the P-type diffusion layer 13, the trench isolations 10 and 11, and the N-type diffusion layer 12, and does not show the other diffusion layers, insulating layers, polysilicon layers, and metal interconnects.

Figure 3:
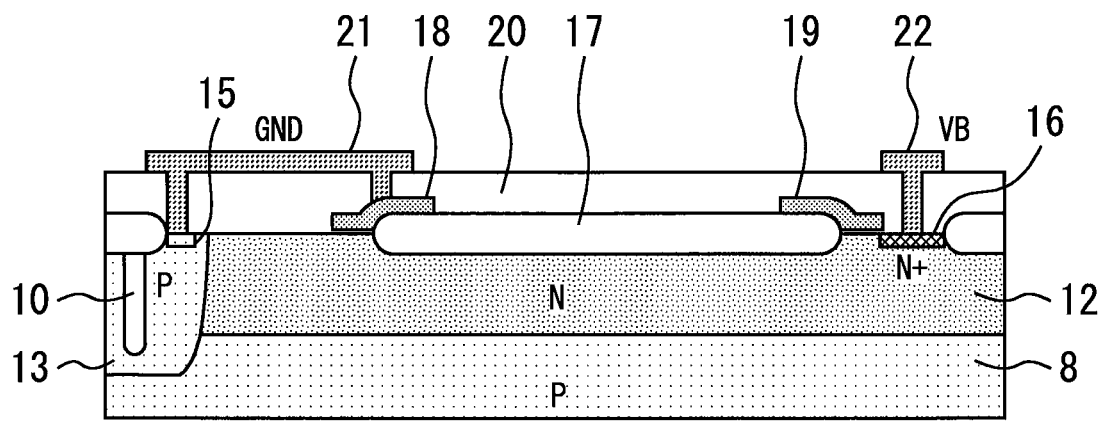
FIG. 3 is a cross-sectional view along I-II of FIG. 2.

FIG. 3 is a cross-sectional view along I-II of FIG. 2. An N-type epitaxial layer (not shown) is provided on the P-type semiconductor substrate 8. The N-type diffusion layer 12 is provided on the N-type epitaxial layer. The N-type diffusion layer 12 satisfies a RESURF condition and has an concentration higher than that of the N-type epitaxial layer. The RESURF condition is $N \times t \cong 1E+12$ [$cm^{-2}$], where N is the concentration of the N-type layer to be depleted [$cm^{-3}$], and t is the thickness [cm].

In the low-side circuit region 5, the P-type diffusion layer 13 is provided in the N-type epitaxial layer and reaches the semiconductor substrate 8. The trench isolation 10 is provided in the P-type diffusion layer 13 and reaches the semiconductor substrate 8. The trench isolation 10 is filled with an insulating film, or provided with an insulating film on side walls and filled with polysilicon (not shown).

A $P^+$-type diffusion layer 15 is provided on a surface portion of the P-type diffusion layer 13. An $N^+$-type diffusion layer 16 is provided on a surface portion of the N-type diffusion layer 12 at a certain distance from the P-type diffusion layer 13. A thermal oxide layer 17 is provided on the surface of the N-type diffusion layer 12 between the P-type diffusion layer 13 and the $N^+$-type diffusion layer 16. Polysilicon portions 18 and 19 are provided such as to cover both ends of the thermal oxide layer 17 and separated from each other at a certain distance. An insulating layer 20 is provided such as to cover these components. A field plate (not shown) is provided inside the insulating layer 20 between the polysilicon portions 18 and 19.

Metal interconnects 21 and 22 are provided on the insulating layer 20. The metal interconnect 21 is electrically connected to the $P^+$-type diffusion layer 15 and the polysilicon portion 18 through a contact hole provided in the insulating layer 20. The metal interconnect 22 is electrically connected to the $N^+$-type diffusion layer 16 and the polysilicon portion 19 through a contact hole provided in the insulating layer 20.

Figure 4:
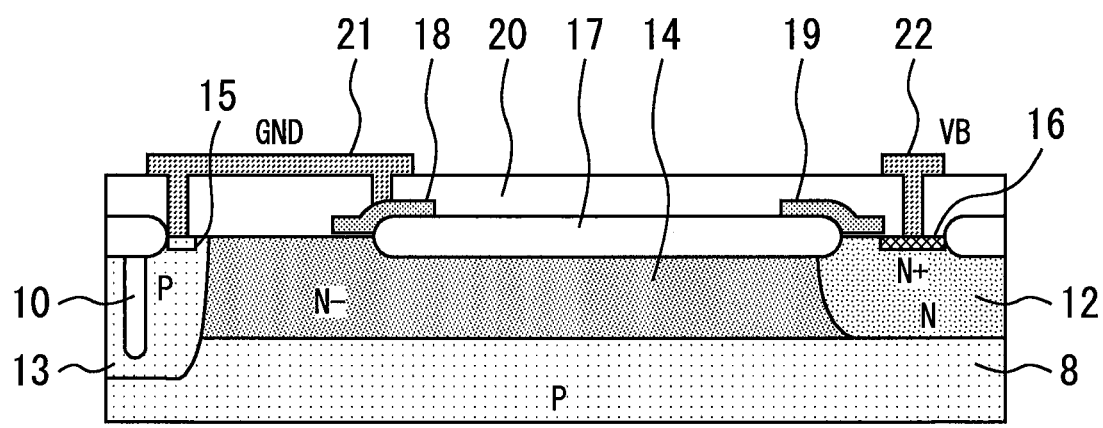
FIG. 4 is a cross-sectional view along III-IV of FIG. 2.

FIG. 4 is a cross-sectional view along III-IV of FIG. 2. The $N^-$-region 14 is provided on the N-type epitaxial layer. One end of the N-type diffusion layer 12 that is provided at a certain distance from the P-type diffusion layer 13, with the $N^-$-region 14 therebetween, is positioned between an end of the polysilicon portion 18 on the thermal oxide layer 17 and an end of the $N^+$-type diffusion layer 16 on the side facing the polysilicon portion 18.

Figure 5:
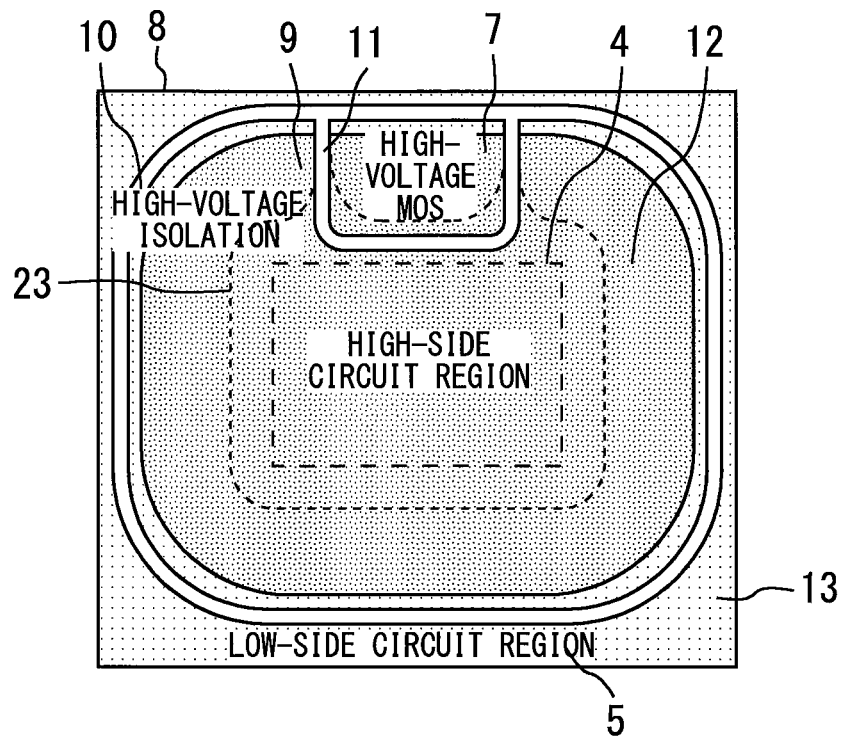
FIG. 5 is a top plan view illustrating a semiconductor device according to the comparative example.

Next, the effects of this embodiment will be explained in comparison to a comparative example. FIG. 5 is a top plan view illustrating a semiconductor device according to the comparative example. No $N^-$-type region 14 is provided in the comparative example. When a high voltage is applied between the high-side circuit region 4 and the low-side circuit region 5, a depletion layer spreads from the interface between the P-type diffusion layer 13 and the N-type diffusion layer 12. However, the depletion is inhibited in the N-type diffusion layer 12 adjoining the trench isolation 11 at the end 23 of the depletion layer on the side of the N-type diffusion layer 12 as compared to other regions, because of which a transient leakage current flows and circuit malfunctions occur.

In this embodiment, the $N^-$-type region 14 having a lower impurity concentration is provided on both sides of the trench isolation 11 so that depletion is accelerated. The transient leakage current that flows when a high voltage is applied is thus reduced and the malfunction tolerance can be improved. Moreover, the high-voltage MOS 7 and the high-voltage isolation region 9 are isolated from each other by the trench isolation 11. Therefore, the electric isolation of the high-voltage MOS 7 and the high-voltage isolation region 9 from each other can be realized with a small area because it is only necessary to secure a sufficient width of the trench isolation 11.

Second Embodiment

Figure 6:
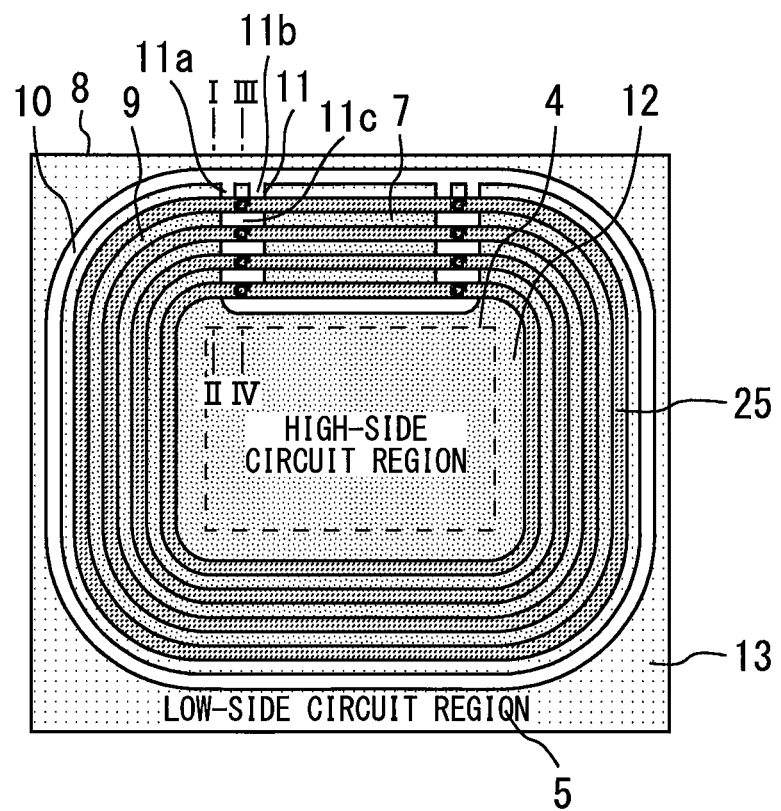
FIG. 6 is a top plan view illustrating the vicinity of the high-side circuit region of the semiconductor device according to a second embodiment.
Figure 7:
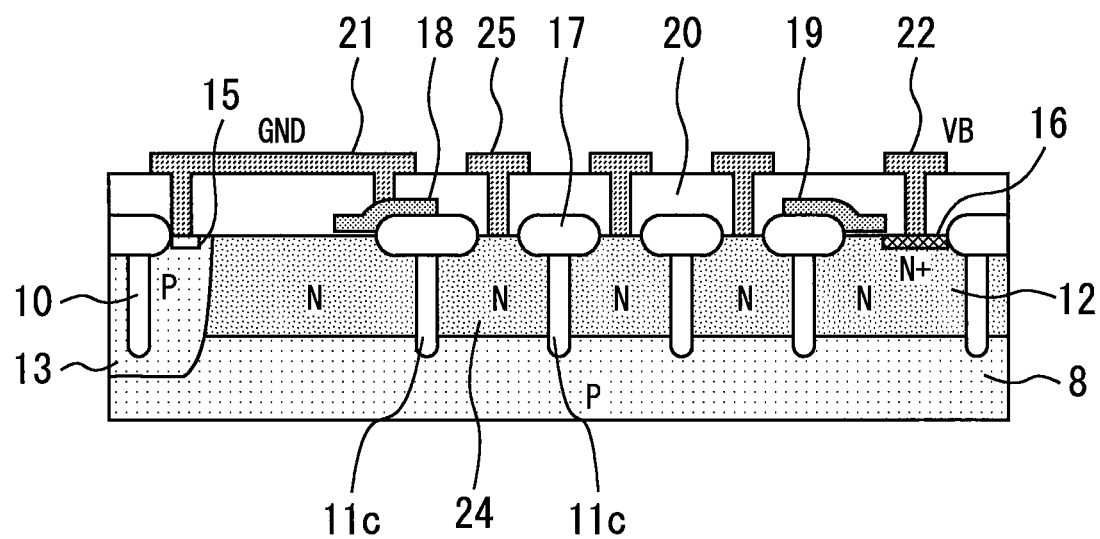
FIG. 7 is a cross-sectional view along III-IV of FIG. 6.
Figure 8:
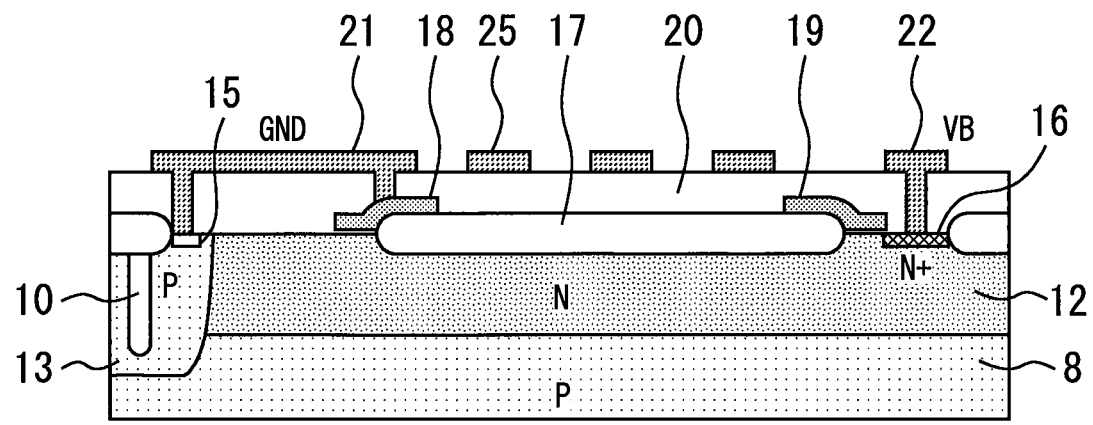
FIG. 8 is a cross-sectional view along I-II of FIG. 6.

FIG. 6 is a top plan view illustrating the vicinity of the high-side circuit region of the semiconductor device according to a second embodiment. FIG. 7 is a cross-sectional view along III-IV of FIG. 6. FIG. 8 is a cross-sectional view along I-II of FIG. 6.

In this embodiment, a plurality of N-type regions 24 are provided inside trench isolations 11a, 11b, and 11c, surrounded by the trench isolations 11a, 11b, and 11c, and isolated from each other. The trench isolations 11a and 11b are provided in a direction from the low side to the high side, while the trench isolations 11c are provided perpendicularly to these.

A plurality of metal interconnects 25 are arranged at constant intervals on the insulating layer 20 from the low side to the high side. The plurality of metal interconnects 25 are each connected to each of the plurality of N-type regions 24 through contact holes provided in the insulating layer 20.

The plurality of metal interconnects 25 apply a potential to the N-type regions 24 stepwise from the low side toward the high side so as to have a potential gradient from the low side to the high side. This field plate effect accelerates depletion of regions of the N-type diffusion layer 12 opposite the plurality of N-type regions 24 via the trench isolation 11. Thus, the same effects as those of the first embodiment can be achieved. Moreover, since there is no need to create a concentration difference in the N-type layer as in the first embodiment, the N-type diffusion layer 12 can be provided by increasing the concentration of the N-type epitaxial layer i.e., the additional step of forming the N-type diffusion layer 12 can be omitted.

The impurity concentration of the plurality of N-type regions 24 may be set freely and independently of the impurity concentration of the N-type diffusion layer 12. If they have the same impurity concentration, the production process can be simplified, as they can be doped with impurities at the same time.

Third Embodiment

Figure 9:
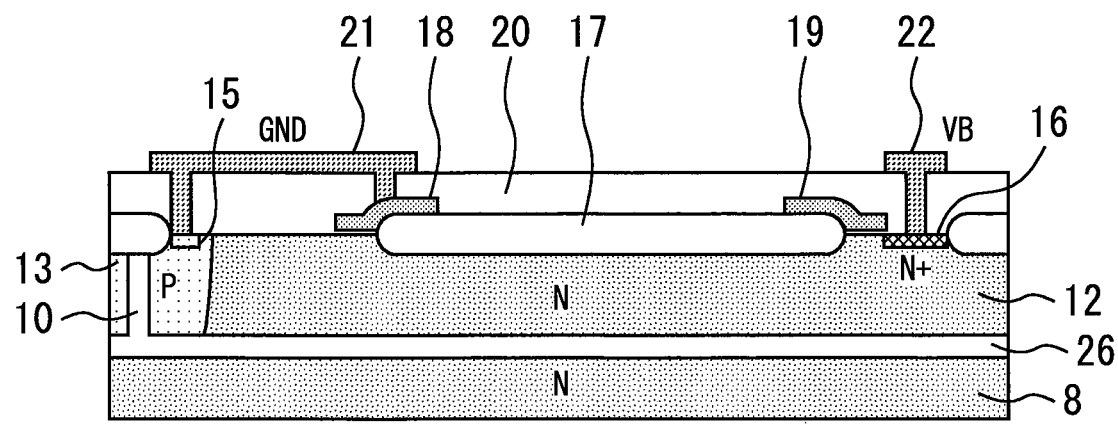
FIG. 9 and FIG. 10 are cross-sectional views illustrating a semiconductor device according to a third embodiment.
Figure 10:
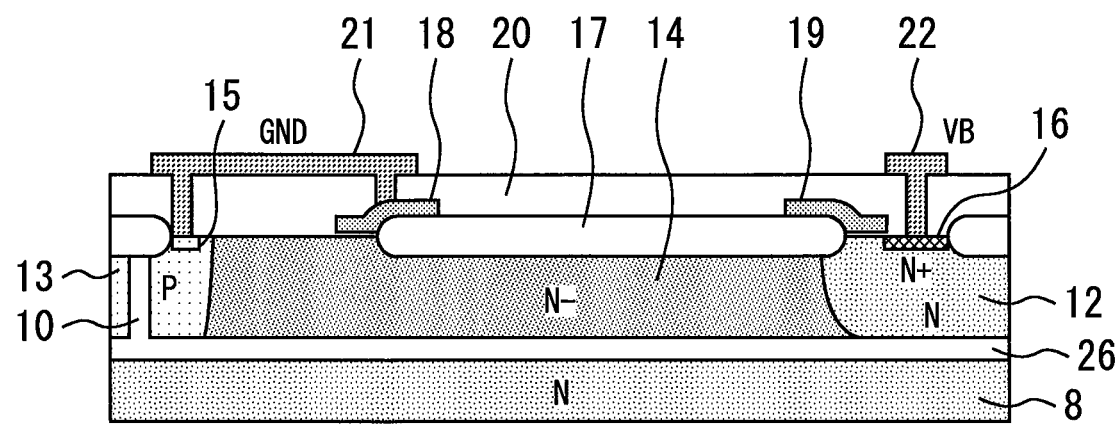

FIG. 9 and FIG. 10 are cross-sectional views illustrating a semiconductor device according to a third embodiment. FIG. 9 corresponds to a cross-sectional view along I-II of FIG. 2, and FIG. 10 corresponds to a cross-sectional view along III-IV of FIG. 2.

While the first and second embodiments use an epitaxial wafer, this embodiment uses an SOI wafer. A buried insulating film 26 is provided between the semiconductor substrate 8 that is the support substrate and the N-type diffusion layer 12. The semiconductor substrate 8 may be an N-type substrate. The trench isolations 10 and 11 surrounding the high-voltage isolation region 9 reaches the buried insulating film 26. As the high-voltage isolation region 9 and the high-voltage MOS 7 are completely isolated from each other by the buried insulating film 26, the parasitic leakage current and junction leakage current can be reduced even more. Other configurations and effects are the same as those of the first embodiment. The configuration of this embodiment may be combined with the second embodiment.

Fourth Embodiment

Figure 11:
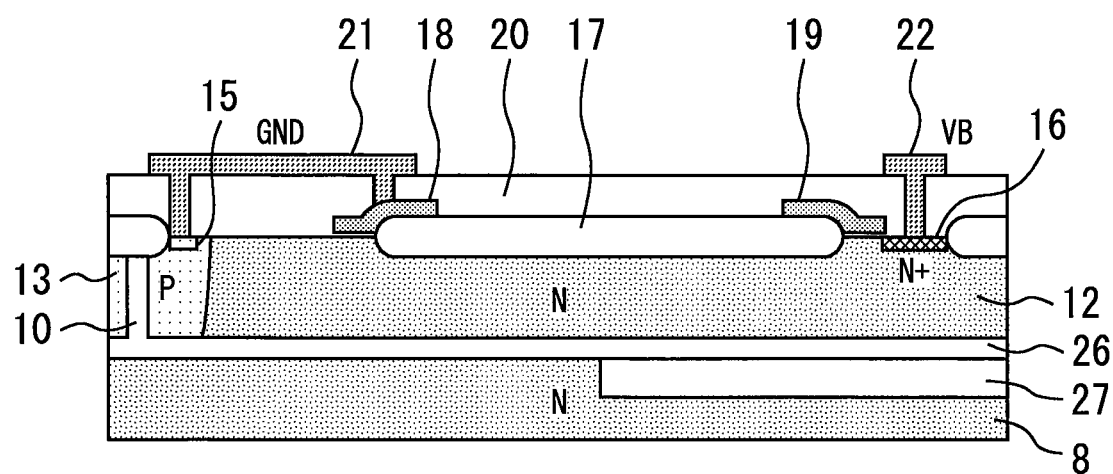
FIG. 11 and FIG. 12 are cross-sectional views illustrating a semiconductor device according to a fourth embodiment.
Figure 12:
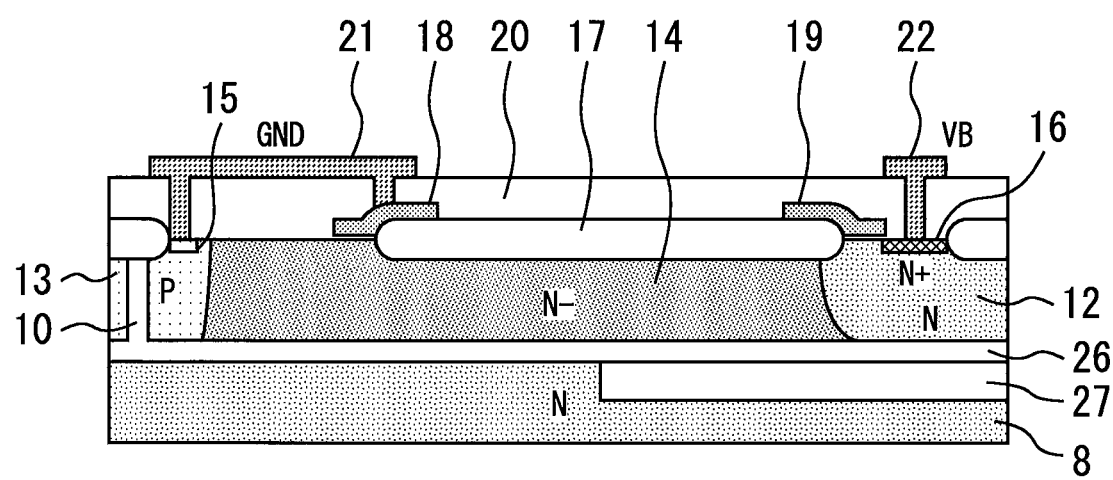

FIG. 11 and FIG. 12 are cross-sectional views illustrating a semiconductor device according to a fourth embodiment. FIG. 11 corresponds to a cross-sectional view along I-II of FIG. 2, and FIG. 12 corresponds to a cross-sectional view along III-IV of FIG. 2. A cavity 27 is provided in the semiconductor substrate 8 under the buried insulation film 26. This Cavity-SOI structure enables the high-voltage isolation region 9 and the high-voltage MOS 7 to have an even higher breakdown voltage than that of the third embodiment. Other configurations and effects are the same as those of the third embodiment.

Fifth Embodiment

Figure 13:
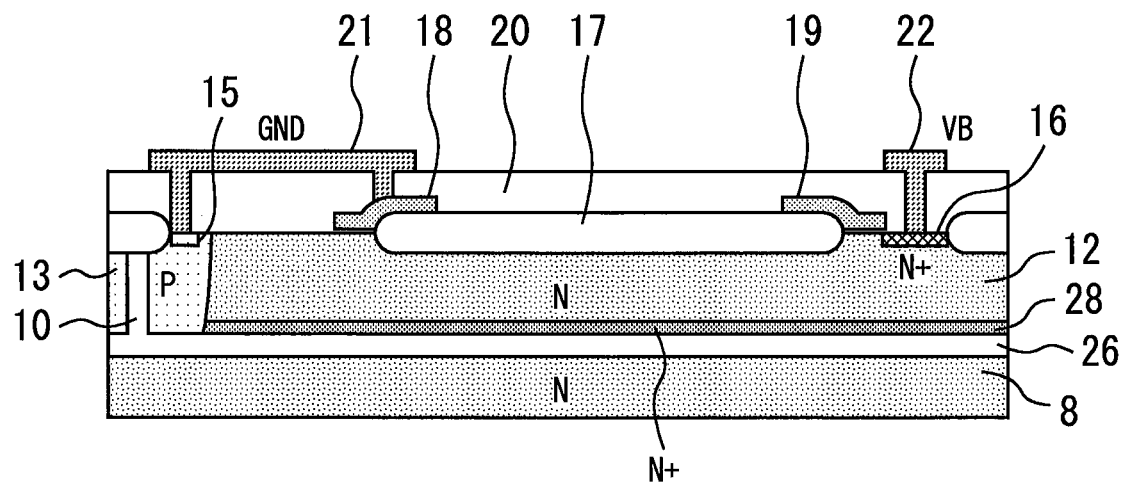
FIG. 13 and FIG. 14 are cross-sectional views illustrating a semiconductor device according to a fifth embodiment.
Figure 14:
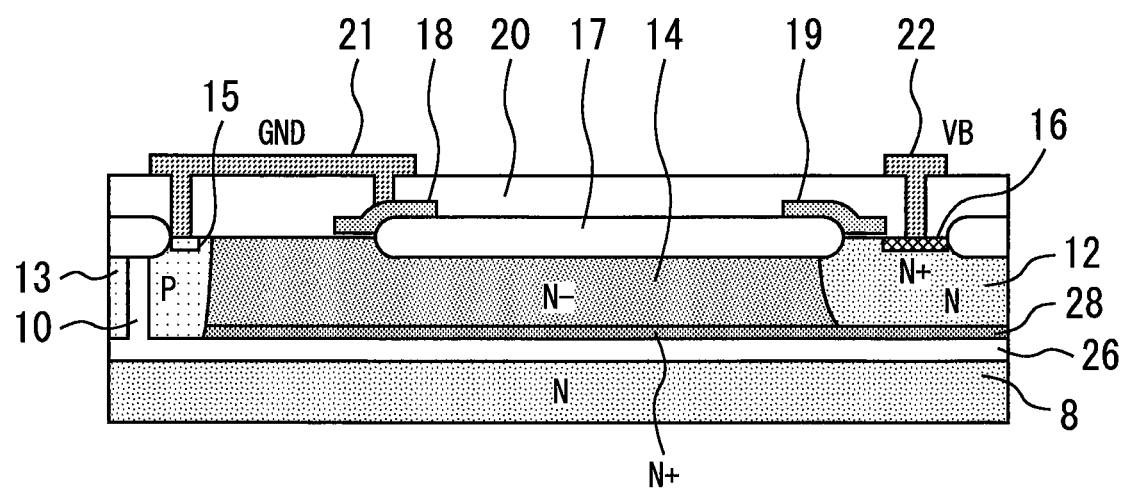

FIG. 13 and FIG. 14 are cross-sectional views illustrating a semiconductor device according to a fifth embodiment. FIG. 13 corresponds to a cross-sectional view along I-II of FIG. 2, and FIG. 14 corresponds to a cross-sectional view along III-IV of FIG. 2. An $N^+$-type layer 28 having a higher impurity concentration than the N-type diffusion layer 12 is provided adjacent the P-type diffusion layer 13 on the buried insulation film 26. This way, the high-voltage isolation region 9 and the high-voltage MOS 7 can have an even higher breakdown voltage than that of the third embodiment. Other configurations and effects are the same as those of the third embodiment.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-247101, filed on Dec. 28, 2018 including specification, claims, drawings and summary, on which the Convention priority of the present application is based, is incorporated herein by reference in its entirety.

The invention claimed is:

1. A semiconductor device wherein a high-side circuit region, a low-side circuit region, and a high-voltage MOS that transmits a signal between the high-side circuit region and the low-side circuit region are provided on one semiconductor substrate, comprising:
   a high-voltage isolation region isolating the high-side circuit region and the low-side circuit region from each other;
   a first trench isolation surrounding the high-voltage isolation region and the high voltage MOS;
   a second trench isolation isolating the high-voltage MOS and the high-voltage isolation region from each other;
   an N-type diffusion layer provided on an upper surface of the semiconductor substrate in the high-side circuit region and the high-voltage isolation region;
   an N-type region provided on both sides of the second trench isolation and having an impurity concentration lower than an impurity concentration of the N-type diffusion layer;
   a P-type diffusion layer and an $N^+$-type diffusion layer provided on the N-type diffusion layer; and
   a thermal oxide layer provided on the surface of the N-type diffusion layer between the P-type diffusion layer and the $N^+$-type diffusion layer, wherein
   conductive polysilicon portions are provided to cover each respective end of the thermal oxide layer, and
   the N-type region is not provided on sides of the first trench isolation.

2. The semiconductor device according to claim 1, further comprising
   a buried insulating film provided between the semiconductor substrate and the N-type diffusion layer, wherein
   the trench isolation reaches the buried insulating film.

3. The semiconductor device according to claim 2, wherein
   a cavity is provided under the buried insulation film.

4. The semiconductor device according to claim 2, further comprising
   an $N^+$-type layer provided on the buried insulation film and having an impurity concentration higher than an impurity concentration of the N-type diffusion layer.

5. The semiconductor device according to claim 3, further comprising
   an $N^+$-type layer provided on the buried insulation film and having an impurity concentration higher than an impurity concentration of the N-type diffusion layer.

6. The semiconductor device according to claim 1, wherein
   the semiconductor substrate is made of a wide-band-gap semiconductor.

7. The semiconductor device according to claim 2, wherein
   the semiconductor substrate is made of a wide-band-gap semiconductor.

8. The semiconductor device according to claim 3, wherein
   the semiconductor substrate is made of a wide-band-gap semiconductor.

9. The semiconductor device according to claim 4, wherein the semiconductor substrate is made of a wide-band-gap semiconductor.

10. The semiconductor device according to claim 5, wherein
the semiconductor substrate is made of a wide-band-gap semiconductor.

* * * * *